US006320354B1

(12) United States Patent
Sengupta et al.

(10) Patent No.: US 6,320,354 B1
(45) Date of Patent: Nov. 20, 2001

(54) METHOD AND APPARATUS FOR BATTERY CHARGING

(75) Inventors: Upal Sengupta, Oregon, WI (US); John W. Oglesbee, Watkinsville, GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/621,266

(22) Filed: Jul. 21, 2000

(51) Int. Cl.[7] .............................. H01M 10/44; H02J 7/14; G01N 27/416
(52) U.S. Cl. ......................... 320/132; 320/157; 324/433
(58) Field of Search .................................. 320/139, 145, 320/157, 132; 340/636; 324/433

(56) References Cited

U.S. PATENT DOCUMENTS 5,032,825 * 7/1991 Kuznicki ........................ 340/636
5,998,968 * 12/1999 Pittman et al. ................. 320/130

OTHER PUBLICATIONS

Microchip Technology Inc., "PIC16C71X 8–bit CMOS Microcontrollers with A/D converter", 1997, reference# DS30272A.*

* cited by examiner

Primary Examiner—Gregory J. Toatley, Jr.
(74) Attorney, Agent, or Firm—Brian M. Mancini

(57) ABSTRACT

A battery charging circuit comprises a recharge input and a recharge output with a switching element electrically coupled in series between the recharge input and output. A recharge controller controls a conducting state of the switching element. When in a conducting state, recharge current can flow from the recharge input to the recharge output, thereby allowing a rechargeable battery coupled to the recharge output to be recharged. During periodically occurring intervals, the recharge controller switches the switching element to a non-conducting state such that the recharge current no longer flows to the recharge output. During the intervals, a battery voltage input is sampled to determine a charge state of the battery. The switching element is subsequently returned to a conducting state when further recharging is necessary, or left in a non-conducting state when sufficient recharging has occurred.

17 Claims, 4 Drawing Sheets

— PRIOR ART —

— PRIOR ART —

METHOD AND APPARATUS FOR BATTERY CHARGING

TECHNICAL FIELD

The present invention relates generally to techniques concerning the use of rechargeable batteries and, in particular, to a method and apparatus for charging such batteries.

BACKGROUND OF THE INVENTION

Rechargeable batteries and their use are well known in the art. Generally, a rechargeable battery is any device capable of storing a charge that is gradually depleted over time as the battery is used to drive a load. Such devices include, but are not limited to, batteries constructed from lithium material, nickel-cadmium (Ni—Cd) material or nickel metal hydride (NiMHO$_2$) material. When the charge is at least partially (but preferably, fully) depleted, the rechargeable battery may be coupled to a charging circuit in order to recharge the battery. (As used in the context of the present invention, the terms "charging", "recharging" and their variants are used interchangeably.) A system for recharging a battery is illustrated in FIG. 1. As shown, the system comprises a charging circuit 102 electrically coupled to a battery 104 to be recharged and to an external power source 106. Operation of the charging circuit 102 usually depends on the type of battery being charged and the type of charging to be performed (i.e., rapid versus normal recharging). In general, however, the charging circuit 102 operates to provide, in a controlled manner, power from the external power source 106 to terminals of the battery 104. The flow of current at various voltage levels through the charging circuit 102 into the battery 104 causes a charge to be increasingly stored within the battery 104. Typically, the battery 104 is considered recharged when it is capable of maintaining a predetermined current level at a predetermined voltage level, i.e., constant power, without the aid of the external power source 106.

A lithium-type rechargeable battery typically exhibits favorable recharging properties in that it can be recharged through the application of a fixed voltage at the battery's terminals. A typical charging profile for lithium-type batteries is illustrated in FIG. 2. During the recharge process of lithium-type batteries, the battery voltage is allowed to increase up to a fixed threshold, and then the current from the external power supply must be gradually decreased in order to maintain this threshold. If the external power supply has a limited output voltage, then the charge current into the battery will naturally taper to a low value as illustrated in FIG. 2. The peak current during the initial charging period (when the battery is low) will be limited to the maximum output of the power source, and the power source output voltage will be pulled down to the battery voltage. The battery is fully recharged when the charge current into the battery decreases substantially to zero or a known low level.

However, in order to determine when the battery has reached such a state, the charging circuit typically comprises relatively complex circuitry for measuring the state of the battery and for controlling the voltage and currents applied to the battery's terminals. For example, conventional methods of battery metering require that the charging circuit measure voltage of the battery, and also measure and/or control current flow into the cell during the charge process. Coulomb-counting methods of battery metering require that the current flow out of the battery during discharge must also be measured. A typical prior art charging circuit 304 is illustrated in FIG. 3. A variable-output power supply 302 is electrically coupled to the charging circuit 304, which in turn is electrically coupled to a battery 306 being recharged. The variable output of the power supply 302 is determined by the battery voltage (via feedback buffer 318) during the recharge process. As the battery increases in voltage, the power supply 302 output increases proportionally in order to provide sufficient "headroom" for the desired current to flow through a sense resistor 308 and a gating device 316. Headroom addresses the fact that the additional circuitry illustrated in FIG. 3 will cause various voltage drops. In order to maintain a given voltage and current level at the battery 306, a margin accounting for these voltage drops, i.e., headroom, must be provided. Current sensing is provided by a sense resistor 308 monitored by a current sense amplifier 310. A control amplifier 312 compares the current measurement provided by the current sense amplifier 310 with a threshold 314 provided by a controller (not shown). The output of the control amplifier 312 is used to control the gating device 316 such that current applied to the battery 306 is properly controlled. Because the controller (typically, a microprocessor) actively controls the charge current through the control amplifier 312, the battery's current charge level can be determined by the amount of taper current into the battery required to maintain the constant voltage.

The additional circuitry required to measure and control current and voltage levels represent an additional cost to charging circuits. In turn, the increased cost of such charging circuits increases the cost of various devices that incorporate them. For example, wireless communications units, such as handheld radiotelephones and the like, typically incorporate such charging circuits. In this manner, a user of a wireless communication unit can simply plug their unit into an external power source and thereby recharge the batteries (either external or internal to the unit) used to power the unit. Previous realizations of portable product designs have eliminated current sensing and/or control circuitry from the device, however these types of systems have lost the capability to accurately determine the battery level, particularly during charging as demonstrated, for example, in applications of the LM3420 series of lithium-ion battery charge controller manufactured by National Semiconductor Corporation. The ability to determine battery level during recharging is a convenient feature that many users of portable devices find useful. Thus, it would be advantageous to provide a technique that solves the problem of determining a battery's level during charging without the requirement for precise current monitoring or control.

SUMMARY OF THE INVENTION

The present invention provides a technique for battery charging that allows a charge state of a rechargeable battery to be determined without the use of complex circuitry for current monitoring or control. In particular, a battery charging circuit is provided comprising a recharge input and a recharge output with a switching element electrically coupled in series between the recharge input and output. A recharge controller controls a conducting state of the switching element. When in a conducting state, recharge current can flow from the recharge input to the recharge output, thereby allowing a rechargeable battery coupled to the recharge output to be recharged. During periodically occurring intervals, the recharge controller switches the switching element to a non-conducting state such that the recharge current no longer flows to the recharge output. During the intervals, a battery voltage input is sampled to determine a charge state of the battery. Depending on the sampled charge state, the switching element is either returned to a conducting state such that further recharging of the battery may occur, or it is left in a non-conducting state when the battery has been sufficiently recharged. Furthermore, the sampled charge state information may be used to drive an indication of the battery's charge state. In this manner, the need for complex current monitoring and control is eliminated while still allowing information regarding the charge state or level of the battery to be determined. These and other advantages and features of the subject invention will become apparent from the detailed description of the invention that follows.

DETAILED DESCRIPTION OF THE PREFERRED EMBODIMENT

Figure 4:
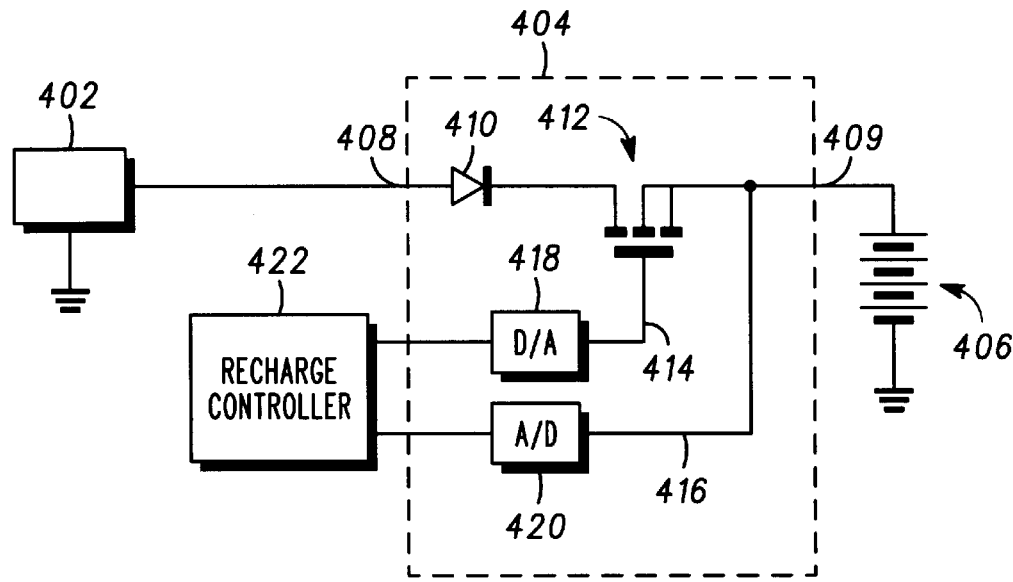
FIG. 4 is a schematic diagram of a charging circuit in accordance with an embodiment of the present invention.

The present invention may be more fully described with reference to FIGS. 4–9. Referring now to FIG. 4, a system comprising a charging circuit 404 electrically coupled to an external power supply 402 and a rechargeable battery 406 is shown. The external power supply 402 preferably comprises a fixed voltage, current limited power supply of the type found in many consumer electronics applications. Examples of suitable external power supplies that may be incorporated and/or modified for use in conjunction with the present invention include the Motorola mid-rate charger having Motorola part number SPN4509A, the Kyocera charger model TXTVL041 and the Sony car adapter charger model DCCE345. As described above, the battery 406 may comprise any device capable of storing a charge that is gradually depleted over time as the battery is used to drive a load including, but not limited to, lithium (preferred), nickel-cadmium or nickel metal hydride type batteries.

The external power supply 402 is coupled to a recharge input 408 comprising a suitable electro-mechanical connector known to those having ordinary skill in the art. Likewise, terminals of the battery 406 are coupled to a recharge output 409 also comprising a connector suitable for creating a mechanical and electrical connection with the battery 406. A switching element 412 is electrically coupled in series between the recharge input 408 and the recharge output 409. In a preferred embodiment, the switching element 412 comprises a solid-state switching element such as a MOSFET device, as shown. Of course, other types of solid-states switching devices, i.e., transistors, may be equally employed. Further still, it is anticipated that other types of switching devices, such as mechanical switches including relays or similar devices, could be used. Regardless, the switching element 412 is characterized in that it may be switched between a conducting state, during which state recharge current is allowed to flow from the recharge input 408 to the recharge output 409, and a non-conducting state, during which state substantially no current is allowed to flow from the recharge input 408 to the recharge output 409.

A current flow inhibitor 410, preferably in the form of a Schottky diode, is also provided. As known in the art, the current flow inhibitor 410 prevent the reverse flow of current, i.e., from the recharge output 409 to the recharge input 408. This is provided to prevent the battery 406 from discharging through the charging circuit 404 during those periods that the charging circuit 404 is coupled to the battery 406 but not otherwise electrically coupled to the external power supply 402.

A control signal output 414 and battery voltage input 416 are also depicted in FIG. 4. A recharge controller 422 drives the control signal output 414. In a preferred embodiment, the recharge controller 422 is implemented using a microprocessor or suitably similar device executing stored software instructions, and the control signal provided by the recharge controller 422 is a digital signal that is subsequently converted to an analog signal via a digital-to-analog converter 418. The D/A 418 may be a discrete component or incorporated into the controller 422. The control signal output 414 provides a control signal to the switching device 412, which control signal is used to control the conducting state of the switching device 412. The battery voltage input 416 acts as an input to the recharge controller 422 during those times that the switching element 412 has been switched to its non-conducting state, as described in greater detail below with reference to FIG. 6. In a preferred embodiment, an analog-to-digital converter 420 is provided to convert analog voltage values into digital signals.

In comparison with prior art charging circuits, the charging circuit 404 illustrated in FIG. 4 is substantially less complex and consequently more cost effective. Such reduced complexity and cost savings are particularly beneficial when such circuits are used in conjunction with wireless communication units.

Figure 5:
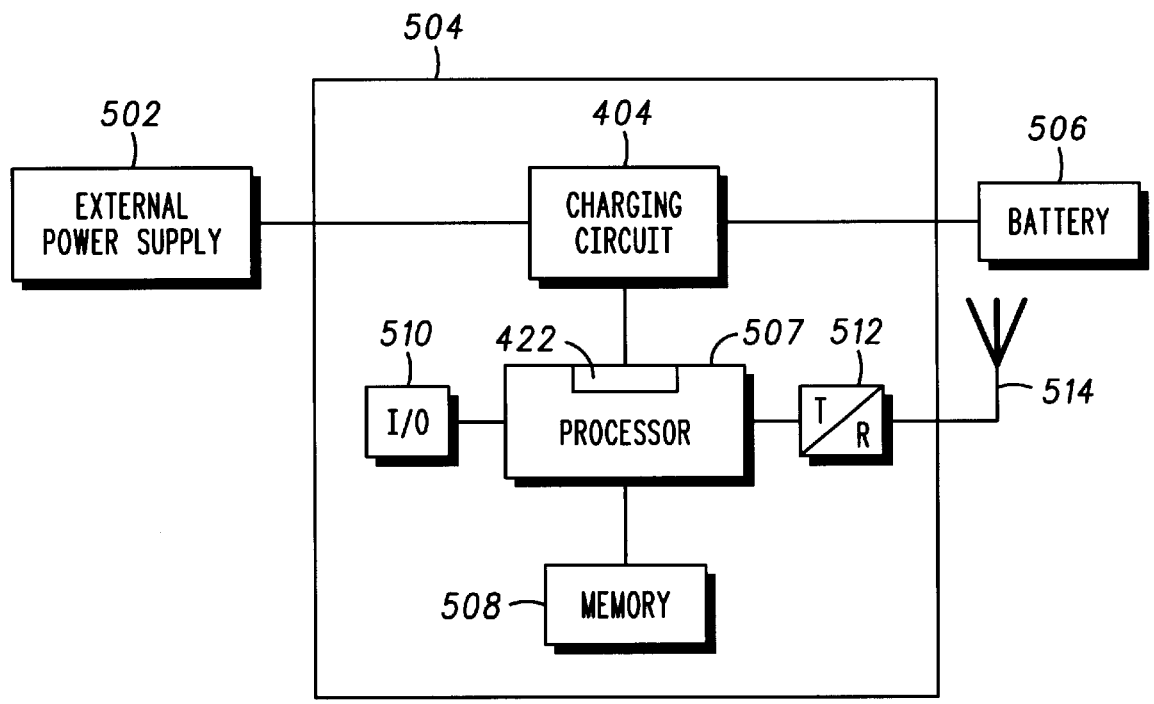
FIG. 5 is a high level block diagram of a system incorporating a wireless communication unit in accordance with the present invention.

FIG. 5 illustrates a system comprising a wireless communication unit 504 coupled to an external power supply 502 and a rechargeable battery 506. The external power supply 502 and battery 506 are substantially similar to the external power supply 402 and battery 406, respectively, described above with reference to FIG. 4. It is understood that the battery 506 can be an external element relative to the communication unit 504 in the sense that it comprises one or more battery cells encased in a housing separate from the communication unit 504. In this case, the battery 506 is electrically and mechanically coupled to the communication unit 504 through suitable connector devices. Alternatively, the battery 506 may be an internal element relative to the communication unit 504, in which case, external electrical and mechanical connectors are not required. Likewise, a functional portion of the external power source 502 may be incorporated into the communication unit 504. For example, where the external power source 502 is derived from alternating current, as is the case in many consumer applications, a DC converter often included as part of the external power source 502 may be incorporated into the communications unit 504. Those having ordinary skill in the art will recognize that other such alternatives may be readily devised for use with the present invention.

The communication unit 504 comprises a processor 506 coupled to memory 508, input and output (I/O) devices 510, transmitter/receiver (transceiver) circuitry 512 and the charging circuit 404, described above. The transceiver circuitry 512 is coupled to an antenna 514. The processor 506 comprises a microprocessor, microcontroller, digital signal processor or a combination of these or similar devices suitable for controlling operation of the communication unit 504. The memory 508 comprises volatile (e.g., random access memory, etc.) and/or non-volatile (e.g., read-only memory, etc.) storage devices used to store data and/or software instructions that can be executed by the processor 506. The I/O devices 510 comprise devices commonly used in wireless communication units to collectively provide a user interface, such as microphones, speakers, buttons and switches, annunciators, and various visual display devices. In a preferred embodiment, the I/O devices 510 comprise a display mechanism suitable for providing the displaying the indicia shown in FIGS. 7–9. The transceiver circuitry 512, in conjunction with the antenna 514, comprise the wireless interface functionality commonly used in wireless communication units. Such circuitry is well known in the art and is therefore not described in detail here.

As known in the art, the processor 506, memory 508, I/O devices 510 and transceiver circuitry 512 are powered by the battery 506 during normal operation, i.e., when the communication unit 504 is used to provide wireless communication services, via connections not shown in FIG. 5. When the battery 506 is being recharged, as described in further detail below, power to these elements of the communication unit 504 is provided by the external power supply 502 via connections not shown in FIG. 5. In a preferred embodiment, when the battery 506 is being recharged through the recharge circuitry 404 included in the communication unit 504, the recharge controller 422 is implemented by the processor 506 executing suitable programming instructions stored in the memory 508. Those having ordinary skill in the art will recognize that other implementations, such as programmable logic arrays or other hardware-based state machines, may be used to provide the recharge controller 422. Regardless of the particular implementation used, operation of the recharge controller 422, as well as the charging circuit 404, is described in greater detail with reference to FIG. 6.

Figure 6:
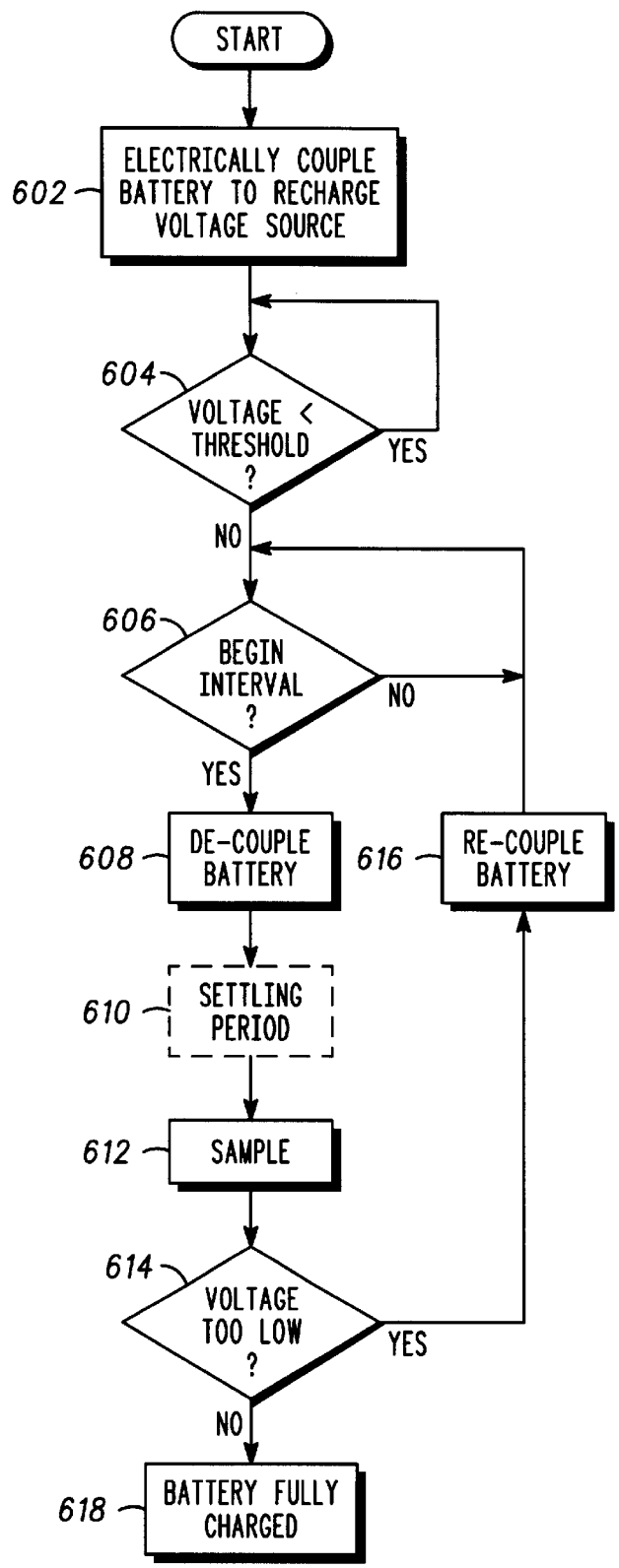
FIG. 6 is a flow chart illustrating a method for battery charging in accordance with the present invention.

FIG. 6 illustrates a flow chart describing a method for battery recharging in accordance with the present invention. At step 602, the battery to be recharged is electrically coupled to a voltage source, i.e., an external power supply. This step presumes that the battery is already mechanically coupled to the charging circuitry. In the context of the charging circuit 404 of the present invention, electrical coupling of the battery to the voltage source is accomplished when the recharge controller 422 issues a control signal via the control signal output 414 that causes the switching element 412 to switch to a conducting state, thereby allowing recharge current to flow to the battery.

Figure 1:
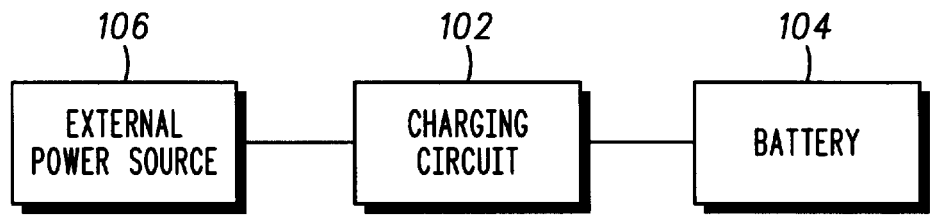
FIG. 1 is a high level block diagram of a system for recharging a battery in accordance with he prior art.
Figure 3:
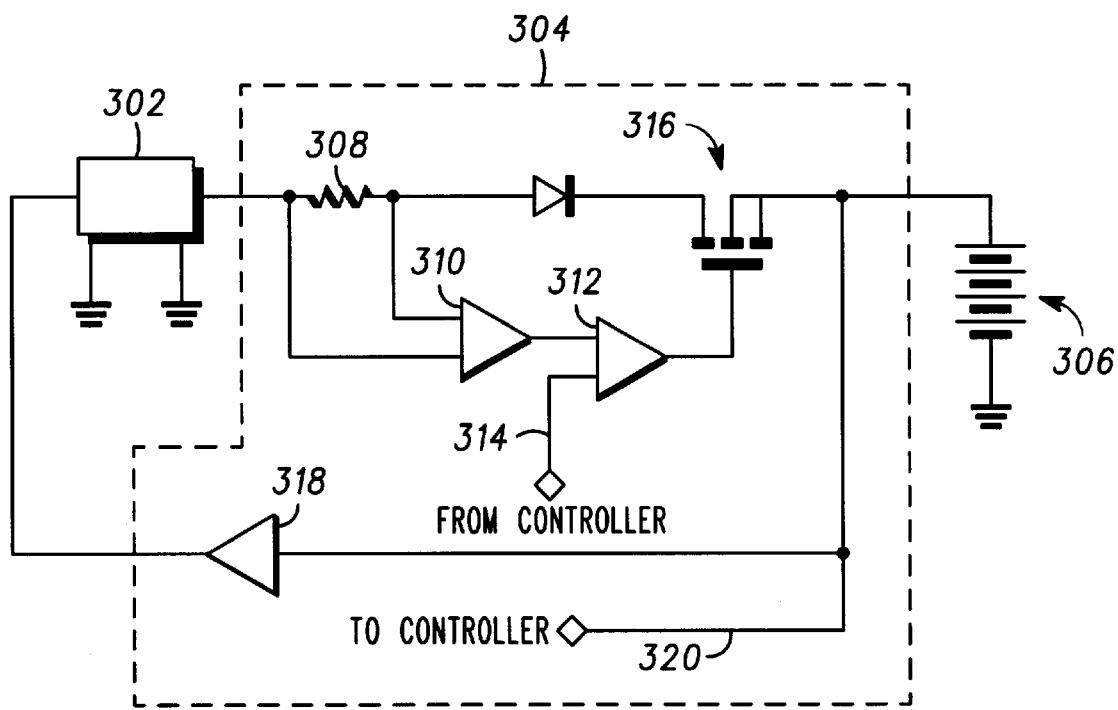
FIG. 3 is a schematic diagram of a charging circuit in accordance with the prior art.
Figure 2:
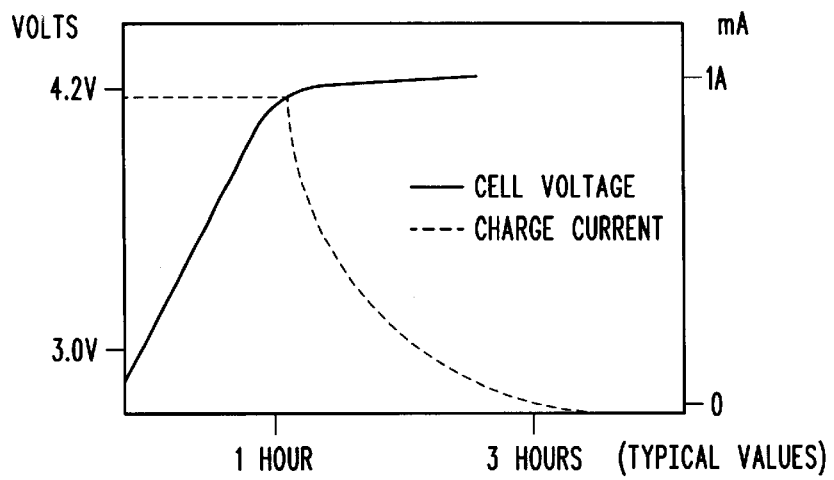
FIG. 2 is a graph of a typical battery charge profile illustrating voltage and current values over time.
Figure 7:
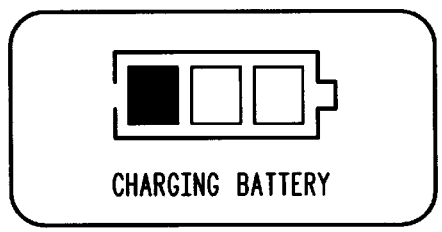
FIGS. 7 through 9 illustrate various exemplary displays in accordance with the present invention.
Figure 8:
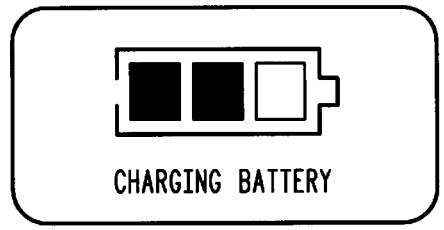
Figure 9:
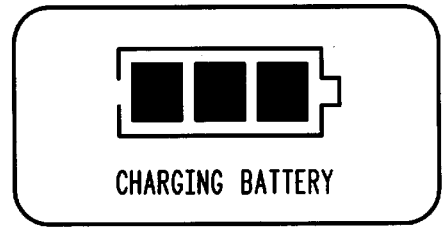

At step 604, it is determined whether the battery voltage has reached a threshold voltage by virtue of the recharging process thus far. Referring to FIG. 4, this is accomplished by having the recharge controller 422 continually monitor the battery's voltage, via the battery voltage input 416, while the switching device 412 is in its conducting state. If the voltage is less than the threshold (for example, 4.2V as shown in FIG. 2), recharging continues as before. To indicate that the battery is being charged, but is currently at a low state of capacity, a display of the type illustrated in FIG. 7 can be displayed by the communication unit via an appropriate I/O device. However, once the threshold has been met at step 604, a display of the type illustrated in FIG. 8 may be displayed indicating that the battery is partially charged.

Once the threshold has been met at step 604, periodic intervals are used to determine when the battery has been fully charged. In the context of the present invention, the periodic intervals are characterized by at least two factors, the periodicity (or frequency of occurrence) of the intervals and the duration of the intervals. The periodicity can be set to virtually any frequency, but should be set to a frequency sufficiently long that meaningful recharging may take place between intervals and sufficiently short that unnecessary charging does not take place after the battery has been fully recharged. For example, with lithium-ion batteries requiring a 4.2V threshold a periodicity in the range of two to ten minutes is acceptable, with a periodicity of five minutes being preferred during initial development of the present invention. The duration of each interval should be long enough to at least perform the operations described in steps 608–614 below. The use of timers, particularly software-based timers, for implementing the periodic interval of the present invention is well known in the art.

When a periodic interval begins, as determined at step 606, the battery is electrically de-coupled from the voltage source at step 608. In the context of the charging circuit 404 of the present invention, electrical de-coupling of the battery from the voltage source is accomplished when the recharge controller 422 issues a control signal via the control signal output 414 that causes the switching element 412 to switch to a non-conducting state, thereby preventing recharge current flow to the battery. This essentially presents an open circuit at the battery's terminals. Optionally, but preferably, a settling period is allowed to pass at step 610 after the step of de-coupling. The settling period allows the battery's output voltage to stabilize after de-coupling. Although the duration of the settling period is a matter of design choice particularly dependent upon the type of battery being recharged, a duration in the range of one second to one minute is acceptable.

At step 612, the output voltage of the battery is sampled to determine the charge status of the battery. Because the switching device is in a non-conducting state at this point, the voltage measured across the battery's terminals will stay at the desired threshold only if the battery has been sufficiently charged, i.e., when the battery no longer draws current while charging. Referring again to FIG. 4, the sampling of the battery's voltage is performed by the recharge controller 422 via the battery voltage input 416. If the sampled voltage is below the threshold after terminating the charge current, then the battery has not yet been fully charged. In this case, the process continues at step 616 where the battery is electrically re-coupled to the voltage source, e.g., by switching the switching element 412 to its conducting state. The process described above repeats starting at step 606 when a subsequent interval begins.

If, however, the sampled voltage from step 612 substantially meets the threshold, then the battery is deemed fully recharged. At this point, a display of the type illustrated in FIG. 9 may be displayed indicating that the battery is now fully charged. Using this method, the present invention eliminates the need for complex current monitoring and control. As a result, the circuitry used to facilitate battery recharging is simplified, thereby leading to more cost effective implementations.

What has been described above is merely illustrative of the application of the principles of the present invention. Other arrangements and methods can be implemented by those skilled in the art without departing from the spirit and scope of the present invention.

What is claimed is:

1. A method for determining charge status during charging of a rechargeable battery, the method comprising steps of:

electrically coupling the battery to a recharge voltage source;

determining when a measured voltage of the battery has reached a threshold voltage;

during a periodic interval, electrically de-coupling the battery from the recharge voltage source;

during the periodic interval, allowing the battery voltage to stabilize during a settling period;

sampling an output voltage of the battery; and electrically re-coupling the battery to the recharge voltage source when the output voltage sampled during the periodic interval is below the threshold voltage.

2. The method of claim 1, further comprising a step of:

displaying a charge status based on the output voltage of the battery.

3. The method of claim 1, wherein the steps of electrically de-coupling, allowing, sampling, and electrically re-coupling are repeated until the output voltage is maintained at the threshold voltage, indicating a full charge of the battery.

4. The method of claim 2, wherein the step of sampling includes determining if the battery voltage stays at the desired threshold voltage, indicating a full charge of the battery.

5. The method of claim 1, wherein a periodicity of the periodic interval is within a range of two to ten minutes.

6. The method of claim 5, wherein the periodicity of the periodic interval is approximately five minutes.

7. The method of claim 1, wherein duration of the settling period is within a range from one second to one minute.

8. A battery charging circuit for determining charge status during charging of a rechargeable battery, the circuit comprising:

a recharge input;

a recharge output;

a switching element electrically coupled in series between the recharge input and the recharge output;

a battery voltage input; and a recharge controller, coupled to the battery voltage input and the switching element, that maintains the switching element in a conducting state wherein recharge current flows from the recharge input to the recharge output until the battery voltage input reaches a threshold voltage, and that then during a periodic interval switches the switching element between a non-conducting state wherein the recharge current does not flow to the recharge output and that samples the battery voltage input to determine a charge state of a battery coupled to the recharge output and a conducting state, wherein during the periodic interval the battery voltage is allowed to stabilize during a settling period before measurement, and the battery voltage is sampled during each periodic interval until the battery maintains the threshold voltage, indicating a full charge of the battery.

9. The battery charging circuit of claim 8, wherein the switching element is a solid-state switching element.

10. The battery charging circuit of claim 9, wherein the switching element is a MOSFET transistor.

11. The battery charging circuit of claim 8, further comprising a current flow inhibitor electrically coupled in series between the recharge input and the switching element that prevents current from flowing towards the recharge input.

12. The battery charging circuit of claim 8, wherein the recharge controller comprises:

a processor;

an analog-to-digital converter electrically coupled between the battery voltage input and the processor; and a memory having stored thereon instructions, executable by the processor, for maintaining the switching element in the conducting state wherein the recharge current flows from the recharge input to the recharge output, switching the switching element to the non-conducting state during the periodic interval wherein the recharge current does not flow to the recharge output, and sampling the battery voltage input during the periodic interval to determine the charge state of the battery coupled to the recharge output.

13. The battery charging circuit of claim 8, wherein a periodicity of the periodic interval is within a range of two to ten minutes.

14. The battery charging circuit of claim 13, wherein the periodicity of the periodic interval is approximately five minutes.

15. The battery charging circuit of claim 8, wherein duration of the settling period is within a range from one second to one minute.

16. A wireless communication unit comprising:

a battery charging circuit for determining charge status during charging of a rechargeable battery, the circuit comprising:

a recharge input;

a recharge output;

a switching element electrically coupled in series between the recharge input and the recharge output;

a battery voltage input; and a recharge controller, coupled to the battery voltage input and the switching element, that maintains the switching element in a conducting state wherein recharge current flows from the recharge input to the recharge output until the battery voltage input reaches a threshold voltage, and that then during a periodic interval switches the switching element between a non-conducting state wherein the recharge current does not flow to the recharge output and that samples the battery voltage input to determine a charge state of a battery coupled to the recharge output and a conducting state, wherein during the periodic interval the battery voltage is allowed to stabilize during a settling period before measurement, and the battery voltage is sampled during each periodic interval until the battery maintains the threshold voltage, indicating a full charge of the battery.

17. The wireless communication unit of claim 16, further comprising an indicator coupled to the recharge controller for indicating a charge status based on samples of the battery voltage input.

* * * * *